US009627301B2

(12) United States Patent
Cuoco

(10) Patent No.: US 9,627,301 B2
(45) Date of Patent: Apr. 18, 2017

(54) INTEGRATED CIRCUIT ARRANGEMENT

(71) Applicant: Ampleon Netherlands B.V., Nijmegen (NL)

(72) Inventor: Vittorio Cuoco, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 14/702,740

(22) Filed: May 3, 2015

(65) Prior Publication Data

US 2015/0348883 A1     Dec. 3, 2015

(30) Foreign Application Priority Data

May 30, 2014   (EP) .................................... 14170698

(51) Int. Cl.
| H03F 3/14 | (2006.01) |
| H01L 23/495 | (2006.01) |
| H01L 23/31 | (2006.01) |
| H01L 27/06 | (2006.01) |
| H01L 29/78 | (2006.01) |
| H03F 3/213 | (2006.01) |
| H03F 3/21 | (2006.01) |
| H03F 3/26 | (2006.01) |

(Continued)

(52) U.S. Cl.
CPC .... *H01L 23/49541* (2013.01); *H01L 23/3107* (2013.01); *H01L 23/49503* (2013.01); *H01L 23/49575* (2013.01); *H01L 23/49589* (2013.01); *H01L 25/16* (2013.01); *H01L 27/0629* (2013.01); *H01L 29/78* (2013.01); *H01L 29/7816* (2013.01); *H03F 3/211* (2013.01); *H03F 3/213* (2013.01); *H03F 3/265* (2013.01); *H01L 23/66* (2013.01); *H01L 2224/48095* (2013.01); *H01L 2224/49113* (2013.01); *H01L 2224/49175* (2013.01)

(58) Field of Classification Search
CPC ............................. H03F 3/211; H01L 23/3107
USPC .................... 330/66, 307; 257/676
See application file for complete search history.

(56) References Cited

U.S. PATENT DOCUMENTS

| 5,901,042 A | 5/1999 | Ota et al. |
| 2014/0022020 A1 | 1/2014 | Aaen et al. |
| 2015/0028955 A1 | 1/2015 | van der Zanden et al. |

FOREIGN PATENT DOCUMENTS

| EP | 2 605 276 A2 | 6/2013 |
| EP | 2 747 134 A1 | 6/2014 |

OTHER PUBLICATIONS

Extended European Search Report for Application No. 14180430.2 (Oct. 8, 2015).

*Primary Examiner* — Khanh V Nguyen
*Assistant Examiner* — Khiem Nguyen
(74) *Attorney, Agent, or Firm* — McDonnell Boehnen Hulbert & Berghoff LLP

(57) ABSTRACT

An integrated circuit arrangement includes a flange, a transistor die, and a first conducting element defining a lead. The flange includes a conducting material and the transistor die is disposed on a surface of the flange. The first conducting element is electrically connected to the transistor die via connecting elements to allow current flow from the transistor die. The flange defines return current paths allowing the current flow via the connecting elements and the lead to return to the transistor die. The flange includes one or more reduced thickness portions that are configured to limit the return current paths and control current flow passing through the flange to the transistor die.

18 Claims, 5 Drawing Sheets

(51) Int. Cl.
*H01L 25/16* (2006.01)
*H01L 23/66* (2006.01)

INTEGRATED CIRCUIT ARRANGEMENT

CROSS-REFERENCE TO RELATED APPLICATIONS

This application claims the priority under 35 U.S.C. § 119 of European patent application no. 14170698.6, filed on May 30, 2014, the contents of which are incorporated by reference herein.

This disclosure relates to integrated circuit arrangements that include active components such as transistors and/or amplifiers, and relates to the configuration of the current return paths in such arrangements.

There is a trend in RF Power base-station amplification techniques to have a number of active transistors in one package in order to save costs while attaining the required power levels. However, in this situation, current distribution effects may occur. That is, the presence of multiple active transistors in the package may affect how the current/voltage is spatially distributed throughout the die. This may be detrimental to the performance of the amplifiers since it may cause a loss in efficiency and in the output power. In some cases, the loss can be as much as 5% in efficiency and as much as 15% in output power.

According to a first aspect there is provided an integrated circuit arrangement comprising:
  a flange, the flange comprising conducting material and having a surface;
  a transistor die disposed on the surface of the flange;
  a first conducting element, the first conducting element being electrically connected to the transistor die to allow current flow from the transistor die;
  wherein the flange comprises one or more reduced thickness portions, the one or more reduced thickness portions being configured to control current flow passing through the flange to the transistor die.

The one or more reduced thickness portions may increase one or more of the inductance, the reactance and the impedance of a circuit path in the integrated circuit arrangement and may thereby increase the efficiency of the integrated circuit arrangement. This may be advantageous as the one or more reduced thickness portions may assist in more evenly distributing the current flow between the substrate and flange. The one or more reduced thickness portions may affect the impedance through the transistor die by adjusting the current distribution to the transistor die.

The reduced thickness portions may have a thickness of between 50% and 95% of the thickness of the bulk of the flange. The thickness of the flange may be in the order of 1 or 2 mm. For example, the thickness of the bulk of the flange may be 1 mm, and the reduced thickness portions may have a thickness of 0.8 mm (i.e. reduced in thickness by 0.2 mm or 20%).

The one or more reduced thickness portions may correspond to one or more pits in the flange surface. The pits may have a depth of a few hundreds microns (e.g. at least one of between 100 and 300 microns, between 300 and 500 microns, between 500 and 800 microns and between 800 and 1000 microns). The pits may be carved into the flange during fabrication. Advantages may include that a reduced thickness portion may be more mechanically stable than, for example, adding additional components to control the inductance. In addition, it will be appreciated that such a reduced thickness portion may be easy to manufacture. In addition, the effect of the reduced thickness portions may not be sensitive to their precise configuration (e.g. size, position, shape). Therefore, relatively large manufacturing tolerances may be accommodated.

The pits may have side walls which make a reflex angle (more than 180° but less than) 360° with a surface of the flange. The pits may have side walls extending away from, and possibly be perpendicular to, the surface of a bottom wall. The surface of a bottom wall may be substantially parallel to the surface of the flange.

The pits may be filled with a material which is less conducting than the flange (e.g. an insulator).

The one or more pits may comprise an elongate trench.

The transistor die may comprise an elongate transistor bar, and wherein the elongate trench is arranged side by side with the elongate transistor bar.

A transistor die may comprise multiple transistors (e.g. up to or more than 100 transistors).

The integrated circuit arrangement may comprise an elongate capacitor bar arranged between the transistor die and the first output terminal, and wherein the trench is located between the elongate capacitor bar and the first output terminal.

The integrated circuit arrangement may comprise an elongate capacitor bar arranged between the transistor die and the first output terminal, and wherein the trench is located between the elongate capacitor bar and the elongate transistor die.

The integrated circuit arrangement may comprise a second conducting element configured to provide for an electrical connection between the die and a second output terminal.

The integrated circuit arrangement may comprise a second conducting element configured to provide for an electrical connection between the die and an input terminal.

Any conducting element disclosed herein may be a lead.

The integrated circuit arrangement may comprise two or more elongate transistor dies. The two or more elongate transistor dies may be disposed end to end on the surface of the flange.

The transistor die may comprise a MOSFET or a LDMOS-based transistor.

The transistor die may be an integrated amplifier die.

It will be appreciated that the location and position of the reduced thickness portions may be dependent on one or more of: the number of active components, the spacing between the active components, the relative position of the active components, the matching configuration, and the frequency of the current. The "matching configuration" (or "Matching network topology") can relate to how the network is adapted to transform the impedance of the transistors to values closer to the final application (e.g. using capacitors and inductors such as bond wires). Typical topologies include, for example, "Inshin", "Low-pass", "Inshin Low-Pass", "Inshin Back-Bond", etc. The pits may be placed in such way to compensate the inequalities in the distribution of impedance.

The integrated circuit arrangement may comprise Over Molded plastic (OMP) packaging. The reduced thickness portions may improve the locking connection with the OMP packaging. That is, the OMP may be configured to mechanically clamp into the trenches (e.g. so that the OMP clips into, or has a friction fit with, the trench.

The substrate may comprise a heat sink portion and a printed circuit board (PCB) portion adjacent to the heat sink portion. The flange may be disposed on top of the heat sink portion.

Throughout the present specification, the descriptors relating to relative orientation and position, such as "back", "front", "top", "bottom" and "side" as well as any adjective and adverb derivatives thereof, are used in the sense of the orientation of the semiconductor device as presented in the drawings. However, such descriptors are not intended to be in any way limiting to an intended use of the described or claimed invention.

The integrated circuit arrangement may further comprise an Over Molded plastic package configured to encapsulate: the flange; the die; and at least a portion of the first conducting element. The encapsulation may provide for a gap between the Over Molded plastic package and the substrate.

Encapsulation of the flange may advantageously improve the mechanical locking of the Over Molded plastic package to the rest of the integrated circuit arrangement.

The integrated circuit arrangement may further comprise: a second conducting element configured to provide a separate electrical connection between the die and a second output terminal disposed on the substrate remote from the first output terminal.

The integrated circuit arrangement may further comprise: a first transistor component disposed on the die, configured to supply and/or receive an electrical signal from the first conducting element; and a second transistor component disposed on the die, distinct from the first transistor component, configured to supply and/or receive an electrical signal from a different conducting element.

The first transistor component may form part of an amplifier. The second transistor component may form part of an amplifier.

The integrated circuit arrangement may comprise a power amplifier. The integrated circuit arrangement may comprise a Doherty amplifier. The first active component may form part of a peak amplifier. The second active component may form part of a main amplifier. The integrated circuit arrangement may comprise one or more dual-in package class AB amplifiers, the integrated circuit arrangement may comprise one or more push-pull amplifier.

There may be provided a communications device, a radio-frequency device, a mobile device or a base-station device comprising any integrated circuit arrangement disclosed herein.

There may be provided an integrated circuit package comprising any integrated circuit arrangement disclosed herein, the first conducting element configured to connect to a first output terminal on a substrate, and the flange configured to connect to a current return terminal on the substrate.

An integrated circuit arrangement may comprise a flange disposed on a substrate and a die disposed on the flange. The active components of the integrated circuit may include transistors and/or amplifiers. The active components may be disposed on the die. The substrate may comprise a printed circuit board (PCB) portion and a heat sink portion, disposed adjacent to the PCB portion.

The flange may be disposed on the heat sink portion of the substrate and may be in direct contact with the heat sink portion.

The integrated circuit arrangement may have an output terminal disposed on the substrate. The output terminal may be electrically coupled, to the die, by a conducting element and a bond wire. In use, electrical current may flow from the die to the output terminal through the bond wire and the conducting element. In use, therefore, electrical current will need to flow through a return path, from the substrate, back to the die. Examples disclosed herein can relate to improvements in the design of current return paths in integrated circuit arrangements.

BRIEF DESCRIPTION OF THE DRAWINGS

The invention will now be described by way of example, and with reference to the enclosed drawings in which:

FIG. 2b is a graph of the impedance of the flange as a function of position along the longitudinal axis of the transistor shown in FIG. 2a;

FIG. 3b is a cross-section view through the integrated circuit arrangement of FIG. 3a;

DETAILED DESCRIPTION

Figure 1A:
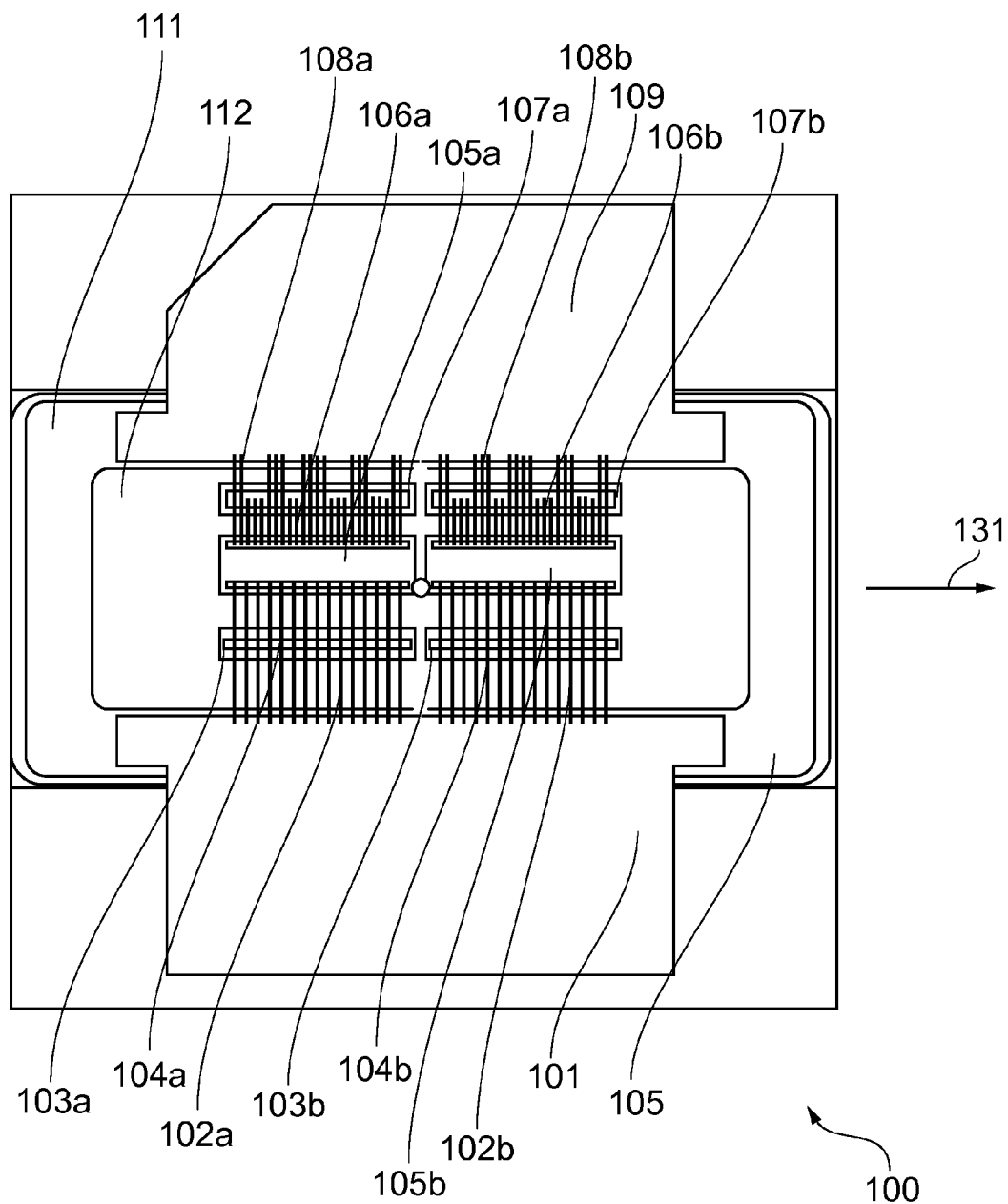
FIG. 1a depicts an integrated circuit arrangement comprising two active transistors dies.

For the sake of convenience, different embodiments depicted in the figures have been provided with reference numerals that correspond to similar features of earlier described embodiments. For example, feature number 1 can also correspond to numbers 101, 201, 301 etc.

For an integrated circuit arrangement (such as an amplifier) composed of a single active transistor die, the amount of non-uniformity in the distribution of the radio-frequency (RF) current along the active die may be generally acceptable.

However, in case of two or more amplifier dies being placed in the same package, the non-uniformity may increase to unacceptable levels. This non-uniformity may have detrimental effects on the overall performance and may result in loss of efficiency and output power.

Examples disclosed herein relate to mitigating the non-uniform distribution of current (and radio-frequency current in particular) by placing one or more reduced thickness portions (e.g. pits or trenches) at specific places in the metallic flange of the package (e.g. in front of the dies).

These one or more reduced thickness portions may be configured to locally change the effective inductance seen by some sections of the transistors, thus leading to a modification of the current distribution. By refining the position, the dimensions and properties of these pits, the distribution effects can be improved.

The reduced thickness portions can be implemented either at input or output side of the packaged amplifier (or both).

Figure 1B:
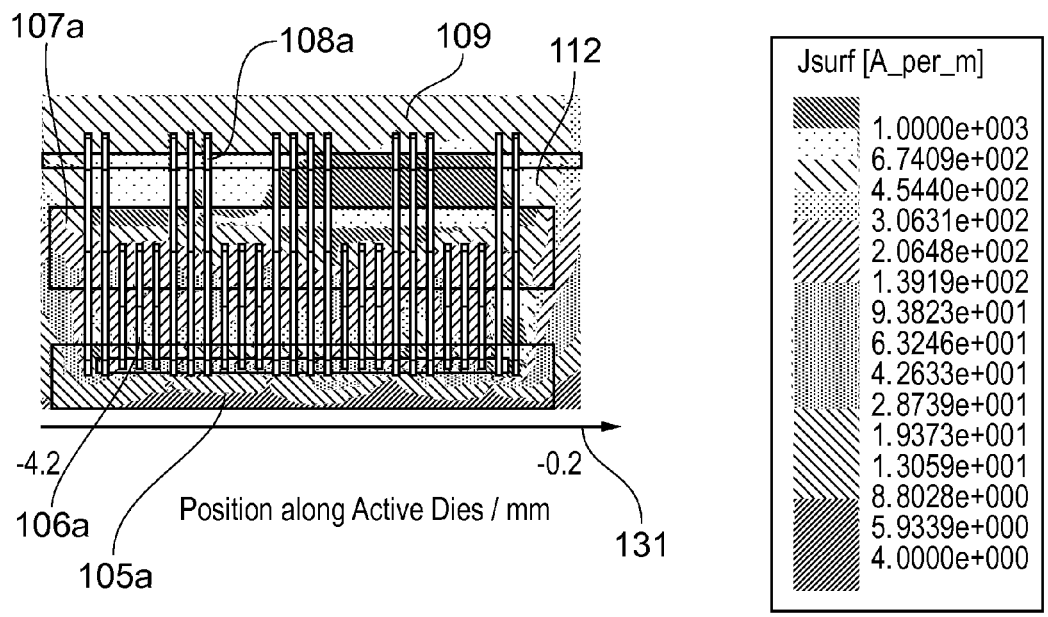
FIG. 1b is the current profile within a flange for an integrated circuit arrangement with a single transistor die.
Figure 1C:
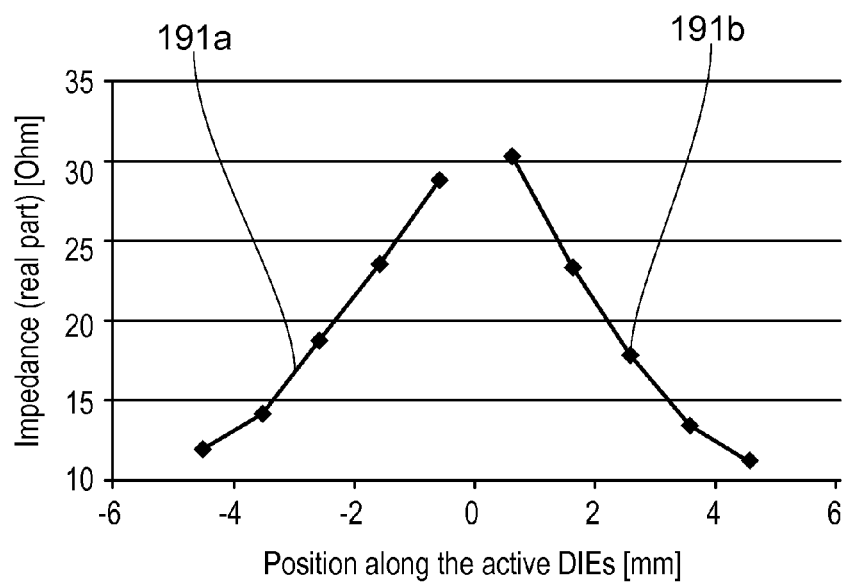
FIG. 1c is a graph of the impedance of the flange as a function of position along the longitudinal axis of the transistor shown in FIG. 1b.

FIG. 1a depicts an integrated circuit arrangement comprising a typical packaged amplifier 100 comprising multiple active transistors dies 105a, 105b, each in parallel configuration. FIG. 1b is a simulated current profile showing how the current is distributed through a flange 112 upon which the transistor dies 105a, 105b are disposed (the frequency of the current for the simulation in this case is 2 GHz). The simulations show the behaviour corresponding to a power of around 100 W. FIG. 1c shows the impedance of the flange 112 as a function of position along the longitudinal axis 131. The impedance is measured between the transistor bar sections and the flange. For example, where the transistor die comprises: a conducting die body in contact with the flange; an insulating die oxide (which may be 10s of microns thick, e.g. between 10 and 50 microns) in contact with the die body; and a transistor bar in contact with the die oxide, the impedance is measured between the transistor bar and the top of the die body (e.g. through the die oxide). In cases where the die body is also made of insulating material (e.g. gallium nitride) which may be 100s of microns thick (e.g. between 100 and 500 microns), the impedance is be measured between the transistor bar and the flange. The impedance of between the transistor bar and the underlying conductor (e.g. the flange, or the die body where the die body is a conductor) may be affected by the current flow which, in turn, may be affected by the reduced thickness portions in the flange.

In this case, the integrated circuit arrangement 100 comprises two active transistor dies 105a, 105b in parallel configuration. In this case, the two elongate transistor dies 105a, 105b are disposed end to end on the surface of the flange 112.

In this case, each active transistor die 105a, 105b may form part of one or more amplifiers, in which case the arrangement 100 may comprise a Doherty amplifier. It may be desirable to include both a main amplifier and a peak amplifier of a Doherty amplifier within the same integrated circuit in order to minimize the overall size and weight of the device. However, the smaller the size of the overall arrangement, the less well electrically isolated from each other the peak amplifier and the main amplifier may be. Good isolation of the two amplifiers of a Doherty amplifier is advantageous for the efficient operation of the Doherty amplifier.

The integrated circuit arrangement, in this case, comprises two parallel sections, each comprising a pre-match capacitor bar 103a, 103b, an active transistor die 105a, 105b (which in this case are active transistor bars) and a post-match capacitor bar 107a, 107b. In each of the parallel sections, the active transistor die 105a, 105b is positioned between the pre-match capacitor bar 103a, 103b and the post-match capacitor bar 107a, 107b. These active transistor dies are electrically connected to the pre-match capacitor bar and the post-match capacitor bar by connecting elements 104a, 104b, 106a, 106b, which in this case are bond wires.

In this case, the integrated circuit also comprises an input conducting element 101 (a lead for a gate terminal, in this case) and an output conducting element 109 (a lead for a drain terminal, in this case). The input conducting element 101 is connected to the transistor dies 105a, 105b via the pre-match capacitor bars 104a, 104b. The input conducting element 101 is electrically connected to the pre-match capacitor bars 104a, 104b via connecting elements 102a, 102b which in this case are bond wires. The output conducting element 109 is connected directly to the active transistor dies 105a, 105b in this case by connecting elements 108a, 108b (e.g. bond wires).

The capacitors 103a, 103b, 107a, 107b and the connecting elements 102a, 102b, 104a, 104b, 106a, 106b, 108a, 108b are used to achieve desired impedance levels for specific applications.

In this case, the transistor dies 105a, 105b and the pre-match capacitors 103a, 103b and post-match 107a, 107b capacitors are disposed on the surface of a single flange 112, the flange 112 comprising a conducting material (e.g. metal). In this case, an insulating ring frame 111 is disposed on the flange to support part of the input and output conducting elements 101, 109.

FIG. 1b shows the simulated current profile showing the current flow through a portion of the flange 112 corresponding to the output half of one of the two active transistor dies. That is, the portion of the flange 112 below the transistor die 105a, the post-match capacitor bar 107a and the output conducting element 109 is depicted. The position of the connecting elements 106a, 108a are also shown. The second transistor 105b of the two transistor dies depicted in FIG. 1a would be positioned to the right of FIG. 1b.

The simulation shown in FIG. 1b indicates an undesirable coupling between the first and second transistor dies 105a, 105b because the current flow in the flange closest to the region between the two transistor dies (to the right of FIG. 1b) is much higher than the current flow in the flange further away (to the left of FIG. 1b) from the region between the two transistor dies.

It will be appreciated that, in this case because of the symmetrical arrangement of the end-on-end transistor dies 105a, 105b, the current flow through the flange portion corresponding to the other 105b of the two active transistor dies would be the mirror image of FIG. 1b (i.e. reflected about a mirror plane which is perpendicular to the longitudinal axis 131 of the integrated circuit arrangement).

The symmetrical nature of the two dies is shown in FIG. 1c, which shows a graph of the impedance of the flange 112 as a function of position along the longitudinal axis 131 of the transistor. The line on the left 191a corresponds to the portion of the flange 112 depicted in FIG. 1b, and the line on the right 191b depicts a corresponding portion of the flange 112 for the other transistor die 105b.

In this example, the transistor dies 105a, 105b operate most efficiently when the impedance is around 19Ω. If the impedance is much higher than this (e.g. around 30Ω) or much lower than this (e.g. 12Ω) then the transistor die portions operate at a much lower efficiency. As shown in the graph of FIG. 1c, the portions of the transistor dies closest to the region between the two transistor dies 105a, 105b have too high impedance, whereas the portions of the transistor dies 105a, 105b closest to the outside have too low impedance. Only portions towards the centre of the respective transistor die have an impedance level which allows the transistor to operate at around optimum efficiency.

It will be appreciated that the specific value for the optimum impedance may be different for different embodiments. In this case, the relative variation of impedance along the length of the transistor die is around ±50%. As will be described below, including reduced thickness portions can reduce the level of this relative variation.

Figure 2A:
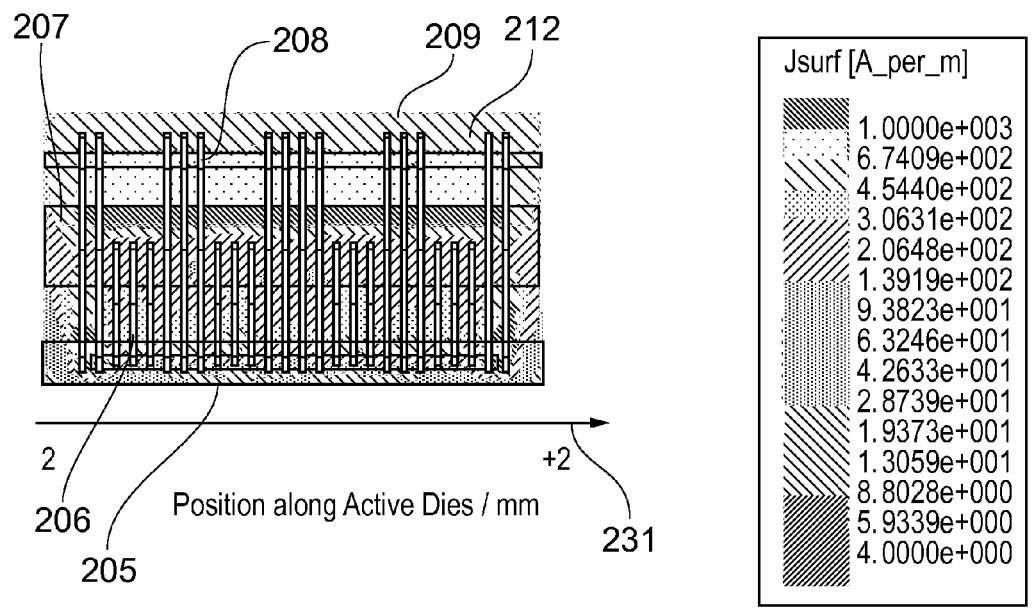
FIG. 2a is the current profile within a flange for an integrated circuit arrangement with a single transistor die.

FIG. 2a is the simulated current profile within a flange 212 if, instead of two transistor dies as shown in FIG. 1a, the integrated circuit only had a single transistor die 205 (which in this case is an active transistor bar). The frequency of the current for the simulation is 2 GHz. That is, FIG. 2a illustrates how a single transistor die would operate when not affected by a neighbouring transistor die.

As for FIG. 1b, FIG. 2a depicts the portion of the flange 231 below the transistor die 205, the post-match capacitor bar 207, the output conducting element 209, and connecting elements 206, 208. As illustrated in FIG. 2a, the current distribution is more consistent along the longitudinal axis of the transistor die than when two dies are present in the integrated circuit.

Figure 2B:
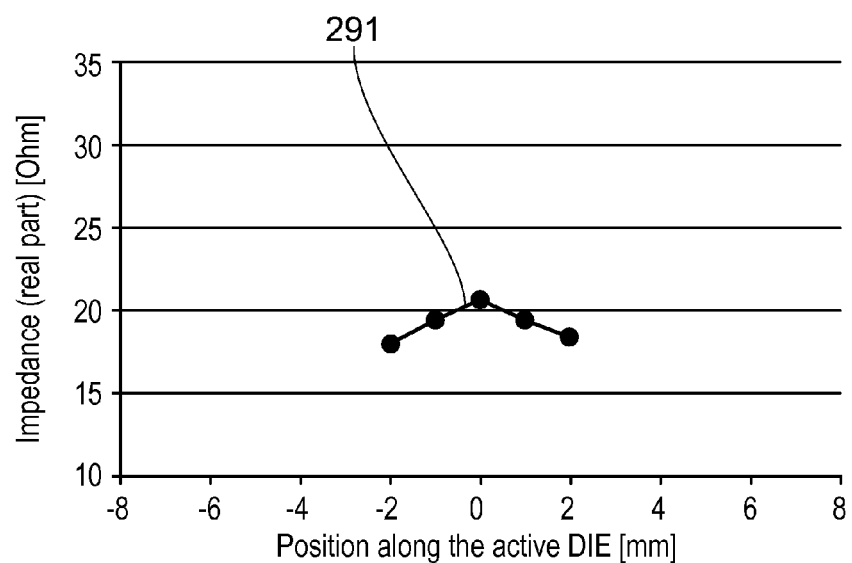

FIG. 2b is a graph of the impedance of the flange 231 as a function of position along the longitudinal axis 231 of the transistor shown in FIG. 2a. For comparison with FIG. 1c, the axes scales have been kept the same. In this example, because there is only one transistor, there is only one line 291 which corresponds to the portion of the flange depicted in FIG. 2a.

As with the embodiment of FIG. 1c, the transistor die operates most efficiently when the impedance of the flange is around 19Ω. As shown in the graph of FIG. 2b, the entire transistor die experiences an impedance of around 19Ω and so can operate at around optimum efficiency. It will be appreciated that, even in this case, there is some variation in the impedance (e.g. the ends of the die might have a different impedance to the centre). Although in this case the variation is less than ±10% compared with around ±50% for FIG. 1c.

Figure 3A:
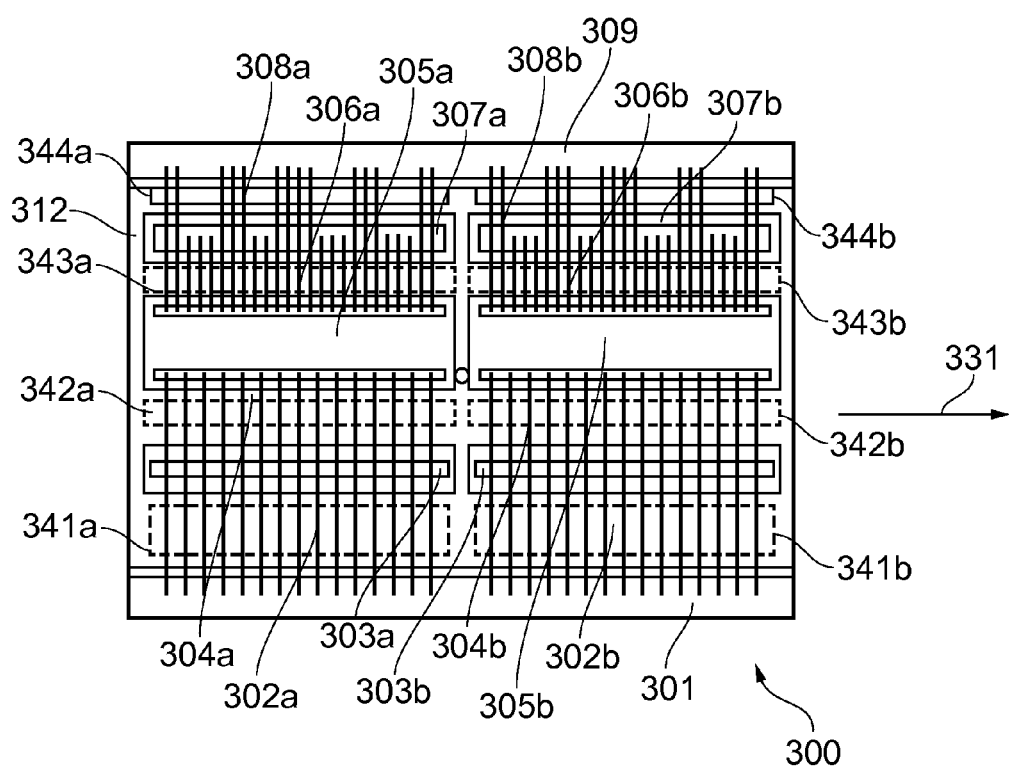
FIG. 3a is an overhead view of an embodiment of an integrated circuit arrangement comprising multiple active transistors, each in parallel configuration.
Figure 3B:
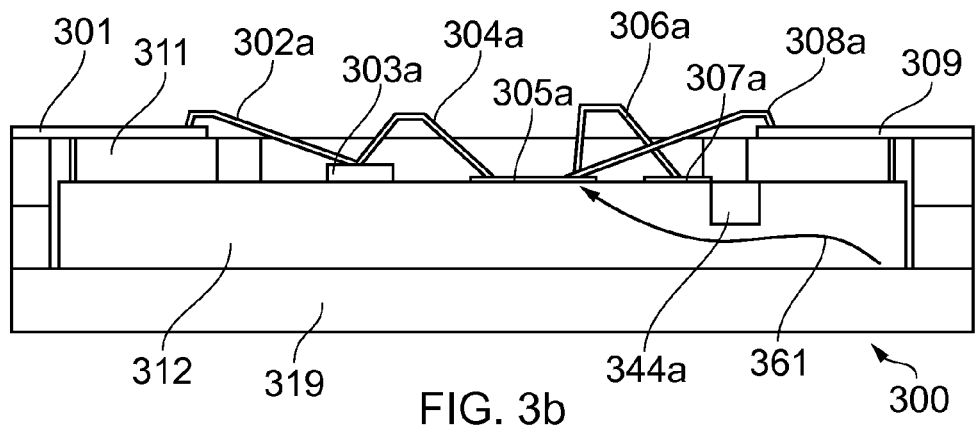
Figure 3C:
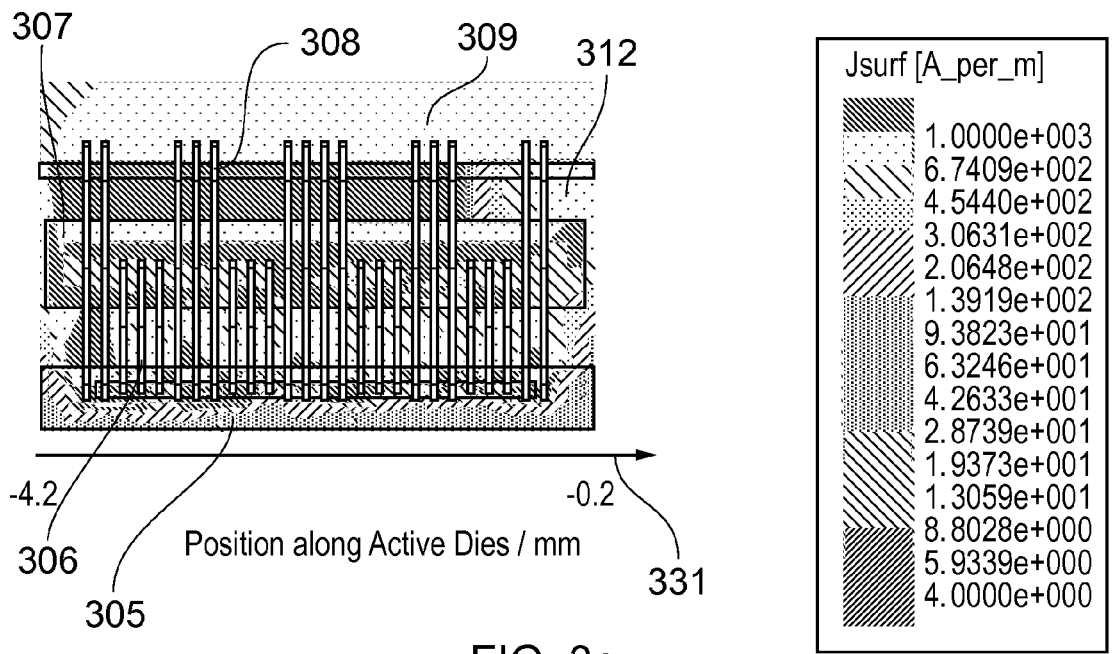
FIG. 3c is a current profile showing how the impedance is distributed through a flange upon which the transistor dies are disposed.
Figure 3D:
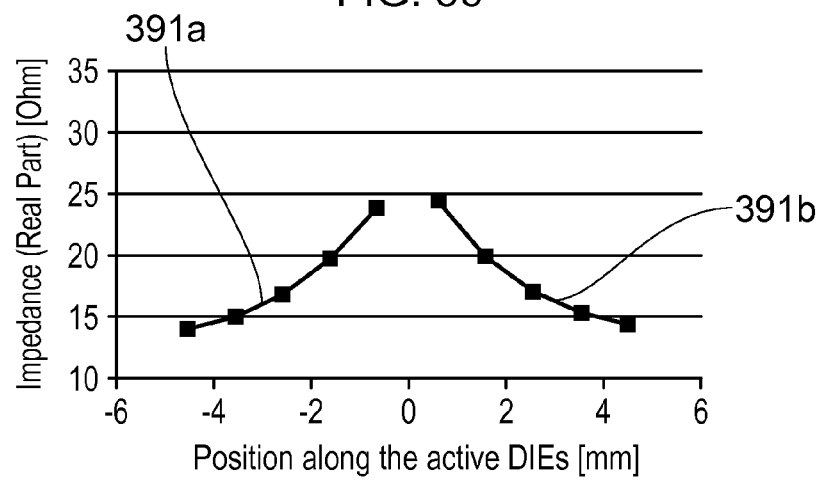
FIG. 3d shows the impedance of the flange as a function of position along the longitudinal axis.

FIG. 3a is an overhead view of embodiment of an integrated circuit arrangement comprising multiple active transistors, each in parallel configuration. FIG. 3b is a cross-section view through the integrated circuit arrangement of FIG. 3a. FIG. 3c is a simulated current profile showing how the current is distributed through a flange upon which the transistor dies are disposed (frequency of the current for the simulation is 2 GHz). FIG. 3d shows the impedance of the flange as a function of position along the longitudinal axis.

As in the example shown in FIG. 1a, in this case as shown in FIGS. 3a and 3b, the integrated circuit arrangement 300 comprises two active transistor dies 305a, 305b in parallel configuration. In this case, the two elongate transistor dies 305a, 305b are disposed end to end on the surface of a flange 312.

The integrated circuit arrangement, in this case, comprises two parallel sections, each comprising a pre-match capacitor bar 303a, 303b, an active transistor die 305a, 305b (which in this case are active transistor bars) and a post-match capacitor bar 307a, 307b. In this case, the active transistor die 305a, 305b is positioned between the pre-match capacitor bar 303a, 303b and the post-match capacitor bar 307a, 307b. These active transistor dies 305a, 305b are electrically connected to the pre-match capacitor bar 303a, 303b and the post-match capacitor bar 307a, 307b by connecting elements 304a, 304b, 306a, 306b, which in this case are bond wires.

In this case, the integrated circuit arrangement 300 comprises an input conducting element 301 (a lead for a gate terminal, in this case) and an output conducting element 309 (a lead for a drain terminal, in this case). In this case, the input conducting element 301 is connected to the transistor dies 305a, 305b via the pre-match capacitor bars 303a, 303b. The input conducting element 301 is electrically connected to the pre-match capacitor bars 303a, 303b via connecting elements 302a, 302b which in this case are bond wires. The output conducting element 309 is connected directly to the active transistor dies 305a, 305b in this case by connecting elements 308a, 308b (e.g. bond wires).

In this case, the transistor dies 305a, 305b and the pre-match 303a, 303b and post-match 307a, 307b capacitors are disposed on the surface of a single flange 312, the flange 312 comprising a conducting material (e.g. metal). In this case, an insulating ring frame 311 (not shown in FIG. 3a) is disposed on the flange 312 to support part of the input and output conducting elements 301, 309. The flange in turn is disposed on a heat sink 319.

In this case, the flange 312 comprises two reduced thickness portions 344a, 344b between the post-match capacitor bars 307a, 307b and the output (drain) conducting element 309. In this case, the reduced thickness portions 344a, 344b each comprise a pit in the form of an elongate trench, wherein the longitudinal axis of the elongate trench 344a, 344b is parallel to the longitudinal axis of the transistor bar 331.

FIG. 3a also shows other optional positions 341a, 341b, 342a, 342b, 343a, 343b for elongate trenches. It will be appreciated that the flanges of other embodiments may have reduced thickness portions located at one or more of these other optional positions instead of, or in addition to, the two reduced thickness portions 344a, 344b described above. That is there may be reduced thickness portions at one or more of the following positions: between the input conducting element and the pre-match capacitor bars 341a, 341b; between the pre-match capacitor bars and the active transistor dies 342a, 342b; between the active transistor dies and the post-match capacitor bars 343a, 343b; and between the post-match capacitor bars and the output conducting element 344a, 344b. The optimal location and longitudinal width of the reduced thickness portions depend on several factors like application frequency and matching configuration. However, it can be identified by the use of a 3D EM simulation tool. An EM simulation tool is a CAD software which allows the accurate simulation of electromagnetic effects in arbitrary 3D structures. In our case, it allows the optimal position and sizes of the pits for each specific case to be identified. Using these kinds of tools, can save costly and time consuming design-on-experiment (DOE) cycles.

In this case, the reduced thickness portion is 50% thinner than the bulk of the flange. In this case, as shown in FIG. 3b, the reduced thickness portion 344a, 344b comprises a pit extending from/into the top surface of the flange (the surface on which the transistor bar and capacitors are disposed). In this case, the bottom surface of the flange is flat. It will be appreciated that in other example embodiments, the reduced thickness portion may be provided by a pit on the bottom surface of the flange (opposite to the surface on which the transistor dies are disposed), or there may be corresponding pits on both the top and bottom surfaces of the flange.

In this case, the pits have side walls which make a reflex angle with a surface of the flange. In this case the reflex angle is around 270°. In this case, the reduced thickness portion has side walls extending away (perpendicularly in this case) from a surface of a bottom wall of the pit, the surface of the bottom wall being substantially parallel to the surface of the flange. Therefore, the side walls can also be said to extend away from the surface of the flange. In this example the side walls perpendicularly extend away from the surface of the flange.

The effect of the reduced thickness portion is to limit the return current paths through the flange to the transistor die (one current path 361 is shown in FIG. 3b). This is because the current cannot pass through the trench 344a of the reduced thickness portion. This has the effect of increasing the inductance of that portion of the flange (compared to a flange with no corresponding reduced thickness portion).

As for FIG. 1b and FIG. 2a, FIG. 3c shows the current flow profile showing the current flow in a portion of the flange corresponding to the output half of one of the two active transistor dies 305a. That is, the portion of the flange below the transistor die 305a, the post-match capacitor bar 307a and the output conducting elements 306a, 308a is depicted. The second transistor 305b of the two transistor dies depicted in FIG. 3a would be positioned to the right of FIG. 1b. As illustrated in FIG. 3c, the current flow distribution is largely consistent along the longitudinal axis 331 of the transistor die.

FIG. 3d shows a graph of the impedance of the flange as a function of position along the longitudinal axis of the transistor shown in FIGS. 3a and 3b. For comparison with FIG. 1c (and FIG. 2b), the axes scales have been kept the same.

As with the embodiment of FIG. 1c, in this example, the transistor die operates most efficiently when the impedance is around 19Ω. If the impedance is much higher than this (e.g. around 30Ω) or much lower than this (e.g. 12Ω) the transistor die portions operate at a much lower efficiency. As shown in the graph of FIG. 3d, both of the transistor dies (line 391a corresponds to transistor die 305a, and line 391b corresponds to transistor die 305b) experiences an impedance ranging between 14Ω and 24Ω along their entire length and so can operate at around optimum, or at least acceptably high, efficiency. That is, in this case, the presence of reduced thickness portions reduces the relative variation of impedance along the length of the transistor die from around ±50% (as shown in FIG. 1c) to around ±25%.

The improved uniformity (reduced non-uniformity) can result in a device with higher efficiency and output power. The increase in efficiency can be in the order of 2%, while the increase in output power can be in the order of 8%. This can be considered significant if one considers that in RF Power transistors (LDMOS) each new generation (which comes every few years) only brings about 2% improvement in efficiency and 10% increase in output power.

It will be appreciated that one or more reduced thickness portions may deliver similar improvement in the case of packaged amplifiers containing three or more parallel active transistors.

It will be appreciated that integrated circuit arrangements comprising a single active transistor die may benefit from having one or more reduced thickness portions in the flange.

The invention claimed is:

1. An integrated circuit arrangement comprising:
a flange, the flange comprising conducting material;
a transistor die disposed on a surface of the flange;
an elongate capacitor bar disposed on the surface of the flange;
a first conducting element defining a lead, the first conducting element being electrically connected to the transistor die via connecting elements to allow current flow from the transistor die;
wherein the flange defines return current paths allowing the current flow via the connecting elements and the lead to return to the transistor die, wherein the flange comprises one or more reduced thickness portions, the one or more reduced thickness portions being configured to limit the return current paths and therewith to control current flow passing through the flange to the transistor die, wherein the one or more reduced thickness portions correspond to one or more pits in the flange surface, wherein the one or more pits comprise an elongate trench, wherein a longitudinal axis of the elongate trench is parallel to a longitudinal axis of the transistor die, wherein the elongate trench is located between at least one of: i) the elongate capacitor bar and the first conducting element or ii) the elongate capacitor bar and the transistor die.

2. The integrated circuit arrangement of claim 1, wherein the one or more pits have a depth of between 100 and 500 microns.

3. The integrated circuit arrangement of claim 1, wherein the transistor die comprises an elongate transistor bar, and wherein the elongate trench is arranged side by side with the elongate transistor bar.

4. The integrated circuit arrangement of claim 1, wherein the elongate capacitor bar is arranged between the transistor die and the first conducting element, and wherein the elongate trench is located between the elongate capacitor bar and the first conducting element.

5. The integrated circuit arrangement of claim 1, wherein the elongate capacitor bar is arranged between the transistor die and the first output terminal, and wherein the elongate trench is located between the elongate capacitor bar and the transistor die.

6. The integrated circuit arrangement of claim 1, wherein the integrated circuit arrangement comprises a second conducting element in the form of a lead configured to provide for an electrical connection, via connecting elements between the die and an input terminal.

7. The integrated circuit arrangement of claim 1, wherein the integrated circuit arrangement comprises two or more elongate transistor dies.

8. The integrated circuit arrangement of claim 7, wherein the two or more elongate transistor dies are arranged end to end on the surface of the flange, in a parallel configuration.

9. The integrated circuit arrangement of claim 1, wherein the integrated circuit arrangement comprises an Over Molded plastic packaging.

10. The integrated circuit arrangement of claim 1, wherein the transistor die comprises a MOSFET or a LDMOS-based transistor.

11. The integrated circuit arrangement of claim 1, wherein the transistor die is an integrated amplifier die.

12. The integrated circuit arrangement of claim 1, wherein the integrated circuit arrangement comprises a power amplifier.

13. The integrated circuit arrangement of claim 12, wherein the power amplifier is a radio-frequency (RF) power amplifier.

14. The integrated circuit arrangement of claim 1, wherein the integrated circuit arrangement comprises at least one of a Doherty amplifier and a push-pull amplifier.

15. The integrated circuit arrangement of claim 1, wherein a longitudinal axis of the elongate trench is parallel to a longitudinal axis of the transistor die embodied as a transistor bar.

16. The integrated circuit arrangement of claim 1, wherein the reduced thickness portion has a thickness of between 50% and 95% of the thickness of the bulk of the flange.

17. The integrated circuit arrangement of claim 1, wherein the reduced thickness portion extends into a top surface of the flange.

18. The integrated circuit arrangement of claim 1, wherein a position of the one or more reduced thickness portions is based on a desired uniformity of impedance along a length of the transistor die.

* * * * *